(12) United States Patent
Lehtonen et al.

(10) Patent No.: US 6,865,074 B2
(45) Date of Patent: Mar. 8, 2005

(54) METHOD OF PRODUCING ELECTRONIC UNIT OF RADIO SYSTEM AND ELECTRONIC UNIT

(75) Inventors: Pasi Lehtonen, Kempele (FI); Kimmo Huhtala, Oulu (FI); Marko Kuusikko, Jaali (FI)

(73) Assignee: Nokia Corporation, Espoo (FI)

( * ) Notice: Subject to any disclaimer, the term of this patent is extended or adjusted under 35 U.S.C. 154(b) by 53 days.

(21) Appl. No.: 10/601,767

(22) Filed: Jun. 24, 2003

(65) Prior Publication Data

US 2004/0052035 A1 Mar. 18, 2004

(30) Foreign Application Priority Data

Jun. 24, 2002 (FI) .............................................. 20021232

(51) Int. Cl.[7] .............................................. H01L 21/48
(52) U.S. Cl. ........................ 361/679; 438/23; 257/690; 29/52
(58) Field of Search ................................ 361/679–681, 361/724–727, 729–730; 438/22–23, 26, 106–111; 257/678, 680, 690–693; 29/592, 592.1, 825; 439/928.1

(56) References Cited

U.S. PATENT DOCUMENTS

| | | | |
|---|---|---|---|
| 4,724,514 A | 2/1988 | Kaufman ................... | 361/338 |
| 5,889,649 A | * 3/1999 | Nabetani et al. ............ | 361/684 |
| 6,160,710 A | 12/2000 | Ahl et al. .................... | 361/707 |
| 6,235,991 B1 | 5/2001 | Johnson ....................... | 174/70 |
| 6,573,592 B2 | * 6/2003 | Bolken ........................ | 257/687 |
| 6,661,667 B2 | * 12/2003 | Robbins et al. ............. | 361/727 |
| 6,773,960 B2 | * 8/2004 | Fee et al. .................... | 438/110 |

\* cited by examiner

Primary Examiner—Hung Van Duong
(74) Attorney, Agent, or Firm—Squire, Sanders & Dempsey L.L.P.

(57) ABSTRACT

The invention relates to a method of producing an electronic unit of a radio system and an electronic unit of a radio system. The electronic unit comprises a mechanical part, a circuit board attached to the mechanical part and an electronic component connected to the circuit board. The method comprises mounting (1702) the electronic component in a cavity provided for the electronic component in the mechanical part; placing (1704) the circuit board on the electronic component and the mechanical part; connecting (1706) the electronic component and the circuit board together using electric coupling members for aligning them with respect to each other and for forming an electrical connection between electric connecting means of the circuit board and electric connecting means of the electronic component; and attaching (1708) the electronic component and the circuit board to each other and to the mechanical part automatically so that the electronic component will be in contact with the mechanical part.

32 Claims, 5 Drawing Sheets

METHOD OF PRODUCING ELECTRONIC UNIT OF RADIO SYSTEM AND ELECTRONIC UNIT

BACKGROUND OF THE INVENTION

1. Field of the Invention

The invention relates to a method of producing an electronic unit of a radio system and an electronic unit of a radio system.

2. Description of the Related Art

In modern radio technology, the production of different electronic units and components has been automated as far as possible to obtain, on one hand, savings in costs and, on the other hand, to ensure uniform quality of the properties of the produced devices. In automatic production, the decrease of the number of manual stages or their omission altogether improves the uniform quality, in which case quality variation due to manual work can be reduced in connection with soldering, for example.

The capacities used in radio technology typically cause heating of devices and components. For this reason, it is necessary to cool the components to be used effectively, in particular high-power components. This can be performed, for example, by connecting a component to a mechanical part of the electronic unit. However, also in this case, the electric connecting means of the component have to be attached to the surface of a circuit board.

In prior art solutions, an electronic component is arranged on a circuit board so that its flange is placed in an opening provided in the circuit board. In that case, the electronic component can be attached to the mechanical part, and electric connecting means can be attached by soldering them to electric connecting means on the surface of the circuit board, in which case high-frequency power passes through the solder joints.

A drawback of the solution is, however, that it includes several manual stages. Components are soldered to the circuit board manually and the equipped circuit board cannot be attached automatically to the mechanics using a robot, for instance. The manual stages increase production costs and constitute a significant cost item in the production of large series, in particular.

A further problem is that due to the manual stages, the properties of electronic units, e.g. high-frequency properties, vary. For example, when a solder joint is made manually, the amount of solder varies, which affects the high-frequency properties.

A further disadvantage of the solutions according to prior art is that when a part of the circuit board is damaged, the whole circuit board usually needs to be broken up since the useful parts cannot be detached without breaking them due to the attachments used. In that case, a further problem is that it is difficult to separate hazardous waste, such as components containing toxic beryllium oxide, from other waste.

SUMMARY OF THE INVENTION

The object of the invention is to provide an improved method of producing an electronic unit of a radio system, an electronic unit of a radio system and an electronic unit of a radio system produced automatically by the improved method.

An aspect of the invention relates to a method of producing an electronic unit of a radio system which comprises a mechanical part, a circuit board attached to the mechanical part and an electronic component connected to the circuit board, the method comprising mounting the electronic component in a cavity provided for the electronic component in the mechanical part; placing the circuit board on the electronic component and the mechanical part; connecting the electronic component and the circuit board together using electric coupling members for aligning them with respect to each other and for forming an electrical connection between electric connecting means of the circuit board and electric connecting means of the electronic component; attaching the electronic component and the circuit board to each other and to the mechanical part automatically so that the electronic component will be in contact with the mechanical part.

An aspect of the invention relates to an electronic unit of a radio system which comprises a mechanical part, a circuit board attached to the mechanical part and an electronic component connected to the circuit board, the mechanical part comprising a cavity in which the electronic component is mounted; a circuit board is placed on the electronic component and the mechanical part; the electronic unit comprises electric coupling members, by means of which the electronic component and the circuit board are aligned with respect to each other, the electronic component comprises electric connecting means which are connected electrically by the electric coupling members of the electronic unit to electric connecting means included in the circuit board; and the electronic component and the circuit board are attached to each other and to the mechanical part so that the electronic component is in contact with the mechanical part.

An aspect of the invention further relates to an electronic unit of a radio system which comprises a mechanical part, a circuit board attached to the mechanical part and an electronic component connected to the circuit board, the electronic unit being produced by a method which comprises: mounting the electronic component in a cavity provided for the electronic component in the mechanical part; placing the circuit board on the electronic component and the mechanical part; connecting the electronic component and the circuit board together using electric coupling members for aligning them with respect to each other and for forming an electrical connection between electric connecting means of the circuit board and electric connecting means of the electronic component; attaching the electronic component and the circuit board to each other and to the mechanical part automatically so that the electronic component will be in contact with the mechanical part.

Preferred embodiments of the invention are disclosed in the dependent claims.

The invention is based on connecting the electronic unit, circuit board and mechanical part to each other in an order which differs from the prior art, i.e. the electronic component is placed on the mechanical part, on which the circuit board is placed, and the electronic component and the circuit board are connected together using electric coupling members for aligning them with respect to each other and for forming an electrical connection between electric connecting means of the circuit board and electric connecting means of the electronic component.

The method enables implementation of an electronic unit of a radio system which is earthed via the mechanical part. The method also enables implementation of an electronic unit of a radio system which can be cooled by connecting the electronic component that is included in the electronic unit and requires cooling to the mechanical part of the electronic unit. In the electronic unit implemented by the method, high-frequency power passes through the electric coupling members instead of solder joints.

The invention provides several advantages. The invention enables either completely or partially automatic production, which speeds up the production process faster and provides savings in costs.

Another advantage is that the quality of electronic units to be produced can be kept uniform. For example, the amount of solder used in electronic connections and how well the mounting of the component on the circuit board succeeds affect the high-frequency properties of the produced electronic unit. Thanks to the invention, the soldering step can be omitted altogether and a component can be aligned more accurately with respect to the circuit board by the attachment means used. In addition, connections can be reproduced easier than in the case of solder joints. Thus electronic units with a more uniform quality can be produced.

A further advantage of the invention is that if a part of the circuit board is damaged, the whole circuit board does not need to be broken down but useful parts can be detached without breaking them thanks to the attachment method used. The case of an electronic component, e.g. a transistor, does not break, either, but remains hermetic. As regards the costs, the share of electronic components, e.g. transistors, is often considerable, and thus their recycling provides economic benefits and simultaneously reduces the amount of waste.

The attachment method based on the use of detachable attachment means also facilitates separation of hazardous waste, e.g. components containing toxic beryllium oxide, from other waste material when the electronic unit is withdrawn from use one day and broken down.

An additional advantage of the invention is that since the electronic component is mounted deeper in the mechanical part than in prior art solutions, heat is conducted better to the mechanical part. Thus the electronic component can be cooled more effectively.

BRIEF DESCRIPTION OF THE DRAWINGS

The invention will now be described in greater detail by means of preferred embodiments, with reference to the accompanying drawings, in which.

DESCRIPTION OF THE PREFERRED EMBODIMENTS

An example of an automatically produced electronic unit of a radio system will be described with reference to FIGS. 1, 2 and 3. The radio system where the electronic unit can be used may be a radio system according to the UMTS system (Universal Mobile Telecommunications System) applying the third-generation WCDMA technology (Wideband Code Division Multiple Access, a '2.5-generation' GSM/GPRS radio system (Global System for Mobile Communications, GSM) applying the GPRS technology (General Packet Radio System), or a radio system applying the second-generation GSM technology, or a hybrid of these, for example. The electronic unit of the radio system may be, for example, a unit of the base station or another electronic unit used in the radio system. The embodiments are not, however, limited to the systems and electronic units described by examples but a person skilled in the art may also apply the solution of the invention to other radio systems and electronic units they include.

Figure 1:
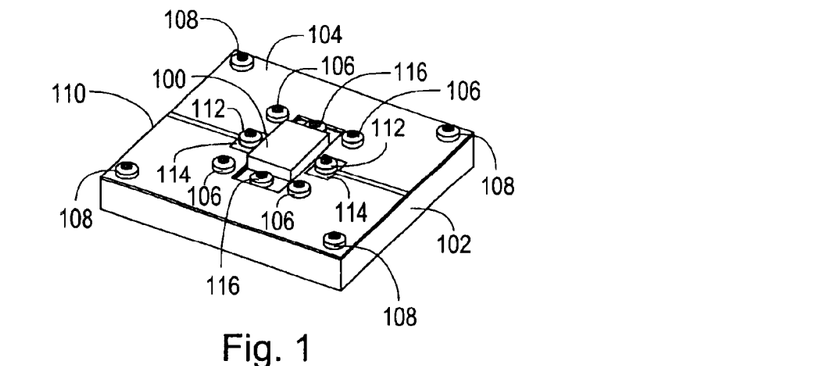
FIG. 1 illustrates an example of an embodiment of an electronic unit of a radio system.

FIG. 1 illustrates an embodiment of the electronic unit 110 of a radio system, which comprises a mechanical part 102, a circuit board 104 attached to the mechanical part 102 and an electronic component 100 connected to the mechanical part 102.

Figure 2:
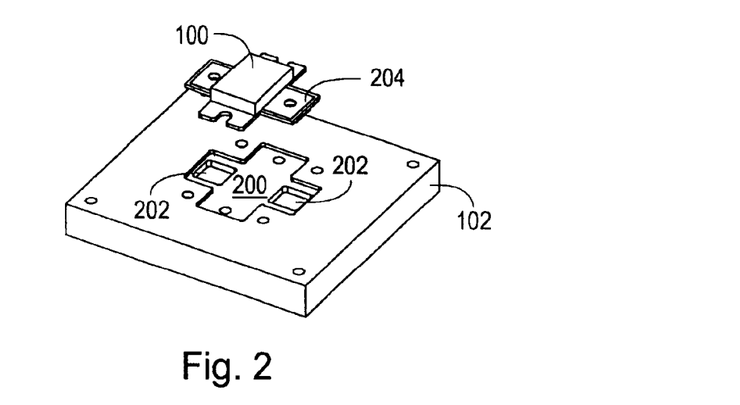
FIG. 2 illustrates an example of an electronic component and a mechanical part according to an embodiment of the electronic unit of a radio system.
Figure 3:
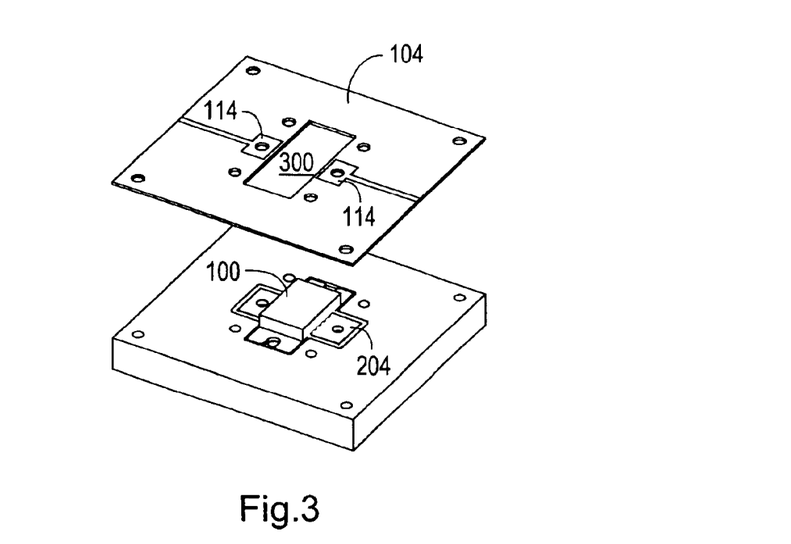
FIG. 3 illustrates an example of the electronic component and a circuit board placed on the mechanical part according to an embodiment of the electronic unit of a radio system.
Figure 4:
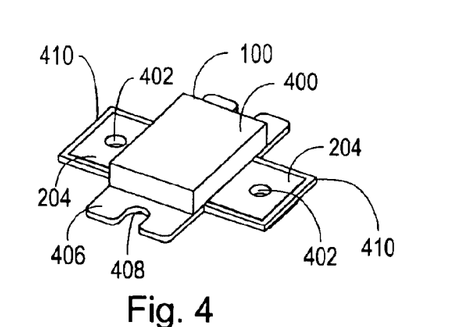
FIG. 4 illustrates an example of the electronic component according to an embodiment of the electronic unit of a radio system.
Figure 5:
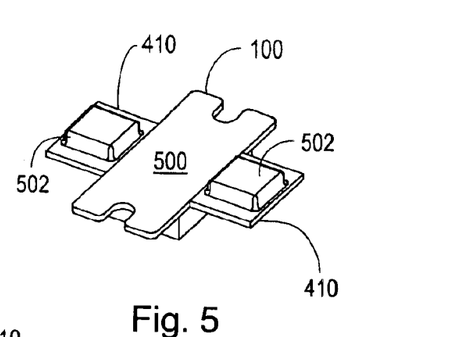
FIG. 5 is a bottom view of the electronic component according to an embodiment of the electronic unit of a radio system.

According to FIGS. 2 and 3, the electronic unit 110 is implemented by mounting the electronic component 100 in a cavity 200 provided in the mechanical part 102, after which the circuit board 104 is placed on the electronic component 100 and mechanical part 102. In our example, the circuit board 104 has been provided with an opening 300 for the electronic component where the electronic component 100 is placed. The electronic component 100 and the circuit board 104 are attached to each other and to the mechanical part 102 automatically so that the electronic component 100 is in contact with the mechanical part 102. The electronic component 100 comprises electric connecting means 204 which are connected electrically to the electric connecting means 114 included in the circuit board 104. The electrical connection is formed using electric coupling members 112, which in our examples are screws, i.e. screw attachment is employed. Instead of screws, other attachment members allowing the establishment of an electrical connection can also be used, for example clamps, pop rivets or compression rivets.

All attachments can be implemented automatically. The attachment of the circuit board 104 to the mechanical part 102 is typically implemented automatically by means of a screwing robot using screws 108 and 106, for instance. The attachment of the electronic component 100 to the mechanical part 102 is typically implemented automatically by means of a screwing robot using screws 116, for instance. The attachments can also be implemented automatically in another way using clamps, for example. The electronic component 100 as well as the circuit board 104 can be placed on the mechanical part 102 either manually or automatically, using e.g. SMD mounting (Surface Mounted Device, SMD) employed typically in the electronics production. The mounting accuracy of the components on the circuit board may also vary from one time to another, in which case the alignment of the electric connecting means and thus the high-frequency properties also vary. The electronic component 100 and the circuit board 104 are connected to each other using electric coupling members 112, i.e. in our example screw attachment, by which the electronic component 100 is aligned with respect to the circuit board 104 and an electrical connection is formed between the electric connecting means 114 of the circuit board and the electric connecting means 204 of the electronic component. The attachment can be implemented automatically.

The electronic component 100 will be described in greater detail by means of FIGS. 1, 2, 4 and 5. The electronic component 100 comprises a flange 406, on which there is the case 400 the electronic component. The flange 406 is provided with notches 408, through which the electronic component 100 is attached to the mechanical part 102 using screws 116. Instead of the notches 408, the flange 406 could equally well be provided with holes, through which the screws 116 would be attached to the mechanical part 102. In our example, the electric connecting means 204 included in the electronic component 100 are connecting strips 204, by means of which the electronic component 100 is connected to the electronics of the circuit board 104, i.e. to the electric connecting means 114 provided in the circuit board 104. In our example, the electric connecting means 204 of the electronic component are on the upper surface of the ears 410 included in the electronic component 100. FIG. 1 illustrated the electric connecting means 114 of the circuit board 104, which are connecting areas in our example, also called pads. The electric connecting means 204 of the electronic component, i.e. connecting strips 204, comprise electrical connection holes 402 for the electric coupling members 112, which are in our example screws, by which the electronic component 100 and the circuit board 104 are connected together. In other words, the electrical connection holes 402 are screw holes in our example. Using the electric coupling means 112, the electronic component 100 is aligned with respect to the circuit board 104 and an electrical connection is formed between the electric connecting means 114 of the circuit board and the electric connecting means 204 of the electronic component.

Figure 6:
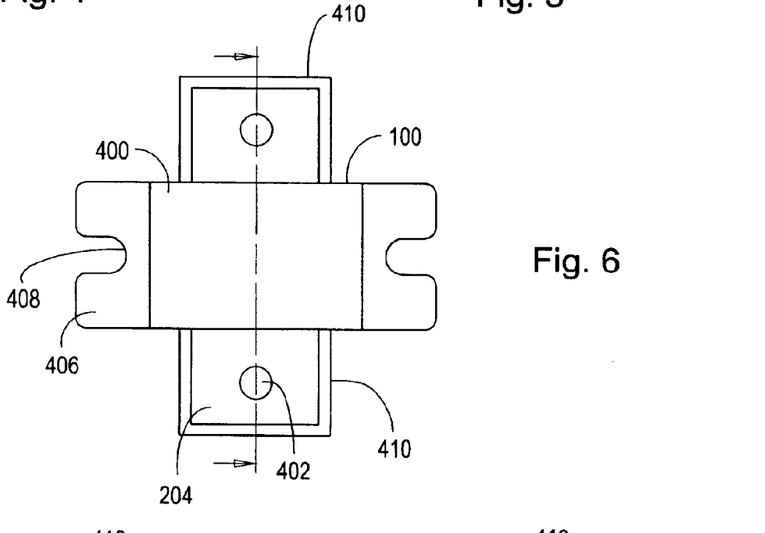
FIG. 6 is a top view of the electronic component according to an embodiment of the electronic unit of a radio system.
Figure 7:
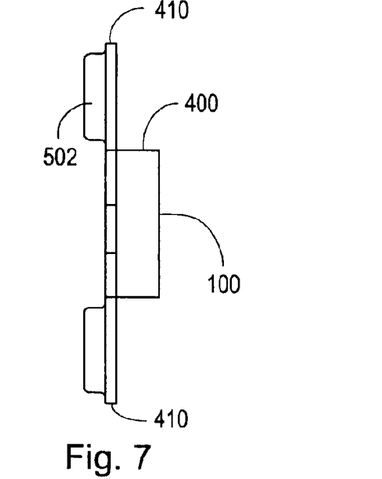
FIG. 7 is a side view of the electronic component according to an embodiment of the electronic unit of a radio system.
Figure 8:
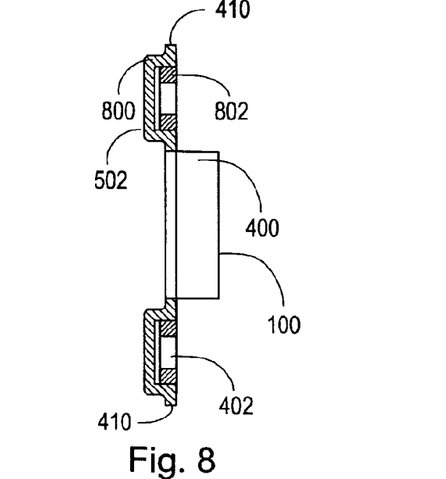
FIG. 8 is a cross section of the electronic component according to an embodiment of the electronic unit of a radio system.

FIG. 6 illustrates a top view of the electronic component 100 according to an embodiment, FIG. 7 illustrates its side view and FIG. 8 its cross section. In our example, the electronic component 100 comprises bottom projections 502 which protrude from the ears 410 and which are mounted in the notches 202 provided in the cavity 200 of the mechanical part 102 when the electronic component 100 is placed on the mechanical part 102. The bottom projections 502 of the electronic component 100 comprise an insulating part 800 which is made of insulating material and placed against the mechanical part 102. The bottom projection 502 comprises a nut portion 802, which is typically placed in the middle of the insulating part 800. The electrical connection holes 402 of the electric coupling members 112, i.e. screws in our example, are in the middle of the nut portion. The electrical connection holes 402, which are screw holes in our example, are typically thread holes, e.g. holes with thread size M3.

Figure 9:
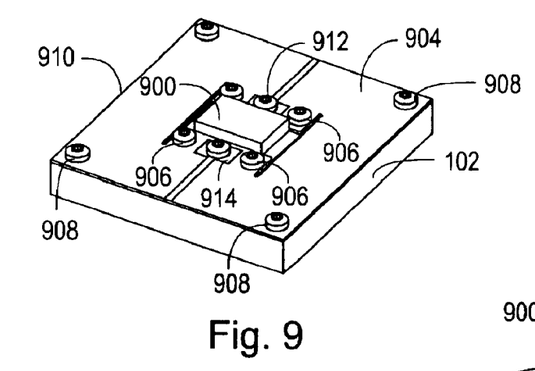
FIG. 9 illustrates an example of another embodiment of the electronic unit of a radio system.
Figure 10:
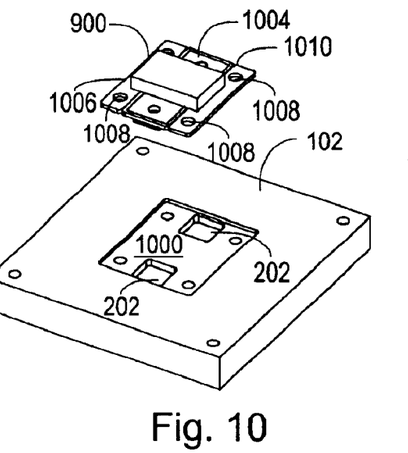
FIG. 10 illustrates an example of an electronic component and a mechanical part according to another embodiment of the electronic unit of a radio system.
Figure 11:
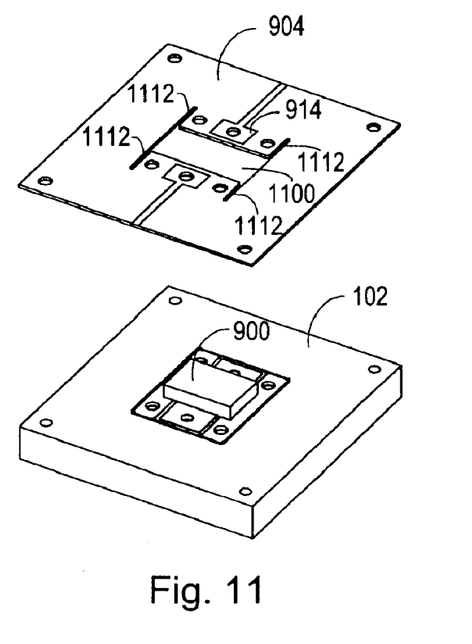
FIG. 11 illustrates an example of the electronic component and a circuit board placed on the mechanical part according to another embodiment of the electronic unit of a radio system.
Figure 12:
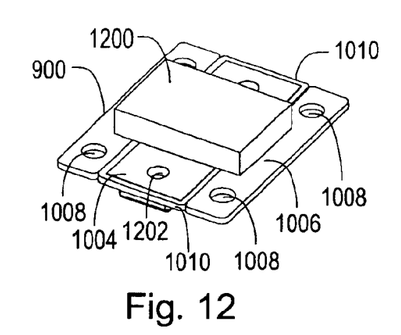
FIG. 12 illustrates an example of the electronic component according to another embodiment of the electronic unit of a radio system.
Figure 13:
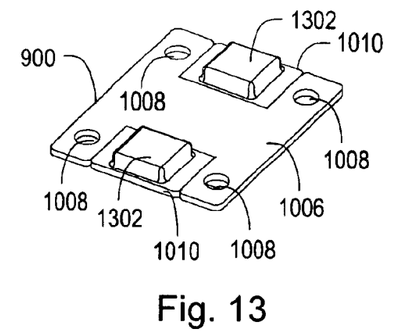
FIG. 13 is a bottom view of the electronic component according to another embodiment of the electronic unit of a radio system.

FIGS. 9, 10 and 11 illustrate an electronic unit 910 of a radio system according to another embodiment. The electronic unit 910 of this example correspondingly comprises a mechanical part 102, a circuit board 904 attached to the mechanical part 102 and an electronic component 900 connected to the circuit board 104. The electronic unit 910 is implemented according to FIGS. 10 and 11 in the same manner as the electronic unit 110 according to the first embodiment, i.e. the electronic component 900 is mounted in a cavity 1000 provided in the mechanical part 102, after which the circuit board 904 is placed on the electronic component 900 and the mechanical part 102. Our example has been implemented so that the electronic component 900 is mounted in an opening 1100 provided for the electronic component 900 in the circuit board 904. The electronic component 900 and the circuit board 904 are attached automatically to each other and to the mechanical part 102 so that the electronic component 900 is in contact with the mechanical part 102. The electronic component 900 comprises electric connecting means 1004 which are connected electrically with electric connecting means 914 included in the circuit board 904. The electrical connection is formed using electric coupling members 912, which are screws in our example.

According to FIG. 11, the circuit board 904 may comprise splits 1112 at the edges of the opening 1100 provided in the circuit board 904. The splits provide additional tolerance in respect of the circuit board thickness.

The second embodiment of the electronic component 900 will be described in greater detail by means of FIGS. 9, 10, 12 and 13. The electronic component 900 comprises a H-shaped flange 1006, which comprises screw holes 1008, through which the electronic component 900 is attached to the mechanical part. 102 using screws 906. Instead of the screw holes, the flange 1006 could equally well comprise notches, through which the screws 906 would be attached to the mechanical part 102. The electric connecting means 1004 included in the electronic component 900 are in our example connecting strips 1004, by means of which the electronic component 900 is connected to the electronics of the circuit board 904, i.e. to the electric connecting means 914 in the circuit board 904. In our example describing the second embodiment, the electric connecting means 1004 of the electronic component are on the upper surface of the ears 1010 included in the electronic component 900. FIG. 9 described the electric connecting means 914 of the circuit board, which are connecting areas 914 in our example, typically 'pads' on the surface of the circuit board 904, for example. The electric connecting means 1004 of the electronic component, i.e. connecting strips 1004, are provided with electrical connection holes 1202 for the electric coupling members 912, by means of which the electronic component 900 and the circuit board 904 are connected together. The electric coupling members 912, which are screws in our example, are used to align the electronic component 900 with respect to the circuit board 904 and form an electrical connection between the electric connecting means 914 of the circuit board and the electric connecting means 1004 of the electronic component.

Figure 14:
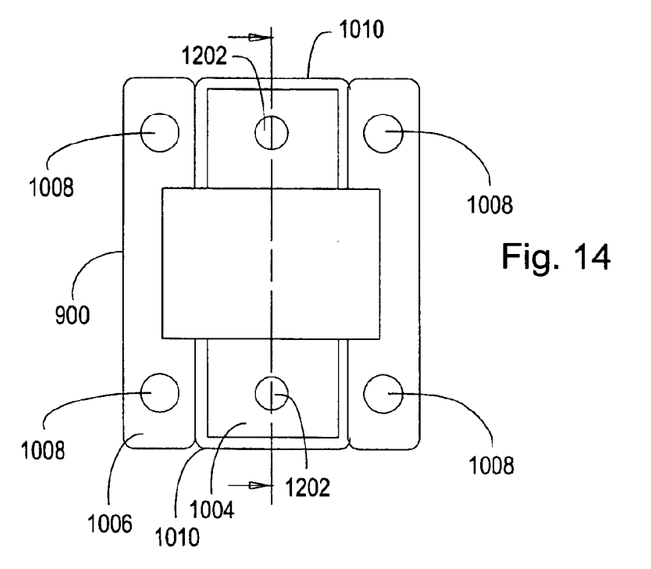
FIG. 14 is a top view of the electronic unit according to another embodiment of the electronic unit of a radio system.
Figure 15:
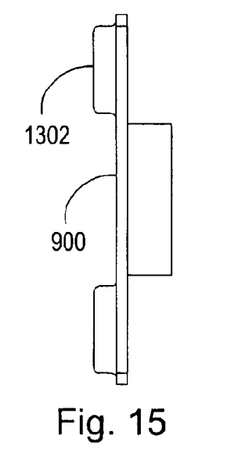
FIG. 15 is a side view of the electronic unit according to another embodiment of the electronic unit of a radio system.
Figure 16:
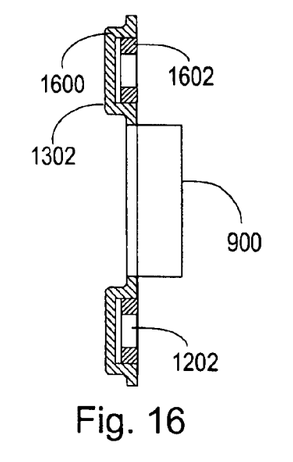
FIG. 16 is a cross section of the electronic unit according to another embodiment of the electronic unit of a radio system.

FIG. 14 is a top view of the electronic component 900 according to the second embodiment, FIG. 15 is its side view and FIG. 16 its cross section. The electronic component 900 comprises bottom projections 1302 which protrude from the ears 1010 and are placed in the notches 202 provided in the cavity 200 of the mechanical part 102 when the electronic component 900 is placed on the mechanical part 102. The bottom projections 1302 of the electronic component 900 comprise an insulating part 1600, which is arranged against the mechanical part 102 and is made of insulating material, e.g. Teflon or another insulating material. The bottom projection 1302 comprises a nut portion 1602, which is typically placed in the middle of the insulating part 1600. The electrical connection holes 1202 of the electric coupling members 912, which are screws in our example, are in the middle of the nut portion. The electrical connection holes 1202, which are screw holes here, are typically thread holes, e.g. holes with thread size M3.

As in the first embodiment described above, also in the second embodiment all attachments can be implemented automatically. The circuit board 904 is typically attached to the mechanical part 102 automatically by a screwing robot using screws 906 and 908, for instance. The electronic component 900 is typically attached to the mechanical part 102 automatically by a screwing robot using screws 906, for instance. The attachments can, however, also be implemented automatically in another manner using clamps, for example. The electronic component 900 as well as the circuit board 904 can be placed on the mechanical part 102 either manually or automatically, using for example SMD mounting (Surface Mounted Device; SMD) typically employed in the electronics production. The electronic component 900 and the circuit board 904 are connected to each other using electric coupling members 912, i.e. screw attachment in our example, by means of which the electronic component 900 is aligned with respect to the circuit board 904 and an electrical connection is formed between the electric connecting means 914 of the circuit board and the electric connecting means 1004 of the electronic component. The attachment can also be implemented automatically.

An advantage of the second embodiment described above is that thanks to the large flange 1006 of the electronic component 900, the electronic component 900 can be cooled even more effectively since the large area of the flange 1006 improves heat conduction to the mechanical part 102.

In the first and the second embodiment described above, the electronic unit 110, 910 is implemented so that the electronic component 100, 900 is mounted in an opening 300, 1100 provided for the electronic component 100, 900 in the circuit board 104, 904. According to a third embodiment, the electronic unit 110, 910 could alternatively be also implemented so that the electronic component 100, 900 is mounted below the circuit board 104, 904, in which case the circuit board 104, 904 comprises no opening 300, 1100. This alternative third embodiment is suitable for electronic components 100, 900 according to both the embodiments described above, i.e. for electronic components of FIGS. 1 to 8 or 9 to 16, for which reason it is not illustrated by separate figures but by the figures illustrating the embodiments described above. The third embodiment can be implemented by making the flange 406, 1006 of the electronic component 100, 900 so thick that the case 400, 1200 of the electronic component and the ears 410, 1010 as well as the bottom projections 502, 1302 can be mounted inside the flange 406, 1006, e.g. in cavities cut in the flange 406, 1006. In other words, the flange 406, 1006 of the electronic component 100, 900 can be made so thick that the electric connecting means 204, 1004 of the electronic component 100, 900, which are connecting strips 204, 1004 in our example, can be mounted in the cavities formed in the flange 406, 1006. In that case, it is unnecessary to provide the mechanical part 102 with separate notches 202 for the bottom projections 502, 1302, but one cavity is sufficient for the electronic unit 110, 910, whose whole bottom surface is smooth. This provides the advantage that the cavity can be easily made automatically in the mechanical part. The cooling of the electronic component 100, 900 can also be improved since the electronic component 100, 900 is mounted deep in the mechanical part 102. Also, the fact that the area of the bottom surface against the mechanical part 102 of the electronic unit 110, 910 is as large as the whole electronic unit 110, 910 makes cooling more effective.

In our example, the electronic component 100, 900 is a high-frequency transistor, i.e. a transistor driven by high-frequency power. The electronic component 100, 900 could also be another component used in radio technology for processing high capacities, for example a high-frequency power resistor, a circulator, a circulator device comprising a circulator, an isolator or a high-frequency amplifier, such as a hybrid amplifier. The method is particularly suitable for devices whose mounting and alignment on the circuit board are critical in respect of their operation.

The high-frequency power transistor 100, 900 used in our examples is an example of components which require cooling and in which the solution can be applied. Other examples are circulator devices which, in addition to a circulator component, comprise power terminals or power attenuators that require cooling. In addition to cooling, earthing is critical to the operation of the high-frequency power transistor 100, 900. Both cooling and earthing can be implemented effectively via the mechanical part 102 by connecting the high-frequency power transistor 100, 900 to the mechanical part 102. The transistor to be used may be similar to the electronic component 100, 900 described above, comprising ears 410, 1010 and bottom projections 502, 1302 installed at the plant. Alternatively, these parts are added to a standard transistor.

When high capacities are used, the electronic component 100, 900 has to be cooled effectively, which is in our example implemented by connecting the electronic component 100 to the mechanical part 102, which includes cooling means (not shown in the figures). Different cooling structures (not shown in the figures) are typically used as cooling means. These include different cooling ribs, which are based on as large a cooling area of the cooler as possible. The cooling ribs may be shaped as ribs, spikes or springs, for instance. The cooling capacity of the cooling means can be improved using a fan or materials with a better heat conductivity, for example.

A further advantage of the solution described may also be that the additional capacitance of the screw connection can be utilized in compensating for the impedance difference between the electronic component and the circuit board. In that case, a further advantage is that the adjusting connection requires less space on the circuit board.

A further advantage of the solution may be that the electronic component required less space since the tolerances needed are smaller.

Figure 17:
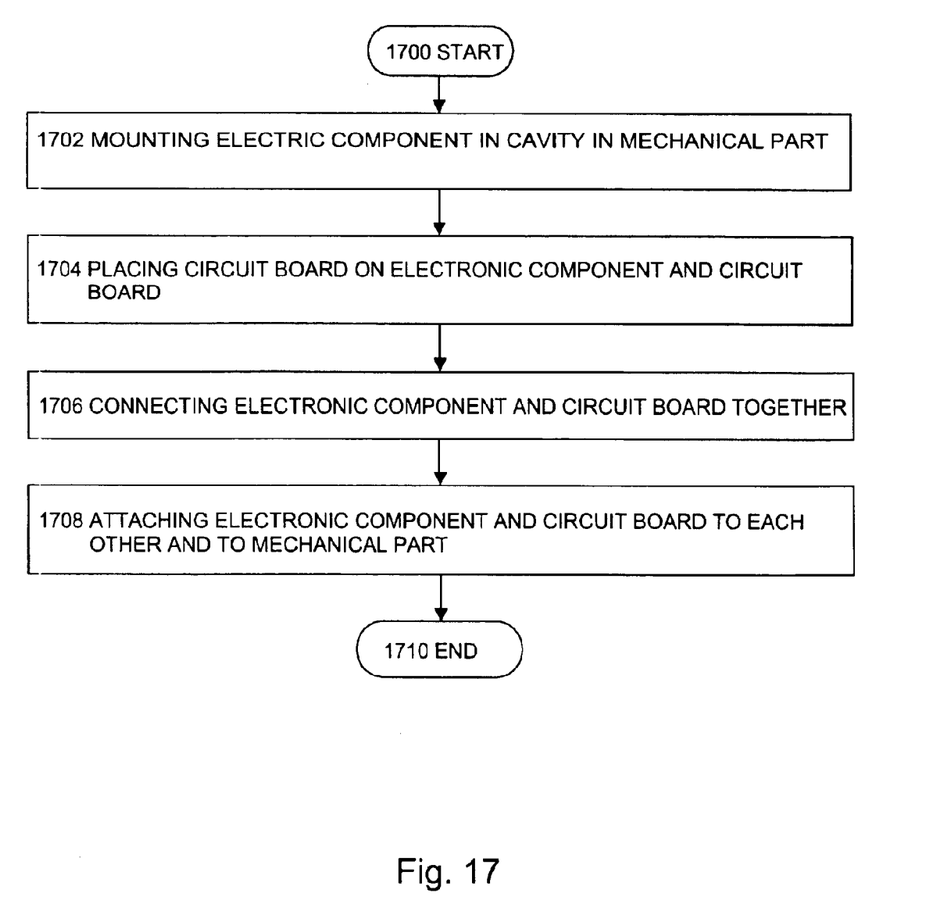
FIG. 17 is a flow chart illustrating a method of producing an electronic unit of a radio system.

Finally, a method of producing an electronic unit of a radio system will be exemplified by means of the flow chart shown in FIG. 17.

The method starts in 1700.

In 1702, the electronic component is mounted in a cavity provided for the electronic component in the mechanical part.

In 1704, a circuit board is placed on the electronic component and the circuit board.

In 1706, the electronic component and the circuit board are connected together, using electric coupling members for aligning them with respect to each other and for forming an electrical connection between electric connecting means of the circuit board and electric connecting means of the electronic component.

In 1708, the electronic component and the circuit board are attached to each other and to the mechanical part automatically so that the electronic component will be in contact with the mechanical part.

The method ends in 1710.

The method enables attachment of all parts to each other automatically. The method also enables mounting of different parts either manually or automatically.

The different embodiments of the method can be implemented applying electronic components, circuit boards, mechanical parts, electric connecting means and electric coupling members, screws or other fasteners similar to those described in connection with FIGS. 1 to 17, but also other implementations are feasible.

Even though the invention was described above with reference to the example according to the accompanying drawings, it is clear that the invention is not limited to them but it may be modified in various ways within the inventive concept disclosed in the appended claims.

What is claimed is:

1. A method of producing an electronic unit of a radio system which comprises a mechanical part, a circuit board attached to the mechanical part and an electronic component connected to the circuit board, the method comprising:

mounting the electronic component in a cavity provided for the electronic component in the mechanical part;

placing the circuit board on the electronic component and the mechanical part;

connecting the electronic component and the circuit board together using electric coupling members for aligning them with respect to each other and for forming an electrical connection between electric connecting means of the circuit board and electric connecting means of the electronic component;

attaching the electronic component and the circuit board to each other and to the mechanical part automatically so that the electronic component will be in contact with the mechanical part.

2. A method according to claim 1, wherein the electric coupling members are screws.

3. A method according to claim 1, wherein the electronic component and the circuit board are attached to each other and to the mechanical part automatically by screwing.

4. A method according to claim 1, wherein the electronic component is cooled via the mechanical part.

5. A method according to claim 1, wherein the electronic component is earthed via the mechanical part.

6. A method according to claim 1, wherein the electronic component is mounted automatically in the cavity provided in the mechanical part.

7. A method according to claim 1, wherein the electronic component is mounted with its bottom against the mechanical part.

8. A method according to claim 1, wherein the circuit board is placed automatically on the electronic component and the mechanical part.

9. A method according to claim 1, wherein the electric connecting means of the circuit board are connecting areas of the circuit board.

10. A method according to claim 1, wherein the electric connecting means of the electronic component are connecting strips of the electronic component.

11. A method according to claim 1, wherein the electronic component is a high-frequency power transistor.

12. A method according to claim 1, wherein the circuit board is arranged on the electronic component and the mechanical part so that the electronic component is placed in an opening provided for the electronic component in the circuit board.

13. An electronic unit of a radio system which comprises a mechanical part, a circuit board attached to the mechanical part and an electronic component connected to the circuit board, wherein:

the mechanical part comprises a cavity in which the electronic component is mounted;

the circuit board is placed on top of the electronic component and the mechanical part;

the electronic unit comprises electric coupling members, which are used for aligning the electronic component and the circuit board with respect to each other;

the electronic component comprises electric connecting means, which are electrically connected to electric connecting means included in the circuit board using the electric coupling members included in the electronic unit;

the electronic component and the circuit board are attached to each other and to the mechanical part so that the electronic component is in contact with the mechanical part.

14. An electronic unit according to claim 13, wherein the electric coupling members are screws.

15. An electronic unit according to claim 13, wherein the electronic component and the circuit board are attached to each other and to the mechanical part automatically by screwing.

16. An electronic unit according to claim 13, wherein the electronic component is cooled via the mechanical part.

17. An electronic unit according to claim 13, wherein the electronic component is earthed via the mechanical part.

18. An electronic unit according to claim 13, wherein the electric connecting means of the circuit board are connecting areas of the circuit board.

19. An electronic unit according to claim 13, wherein the electric connecting means of the electronic component are connecting strips of the electronic component.

20. An electronic unit according to claim 13, wherein the electronic component is a high-frequency power transistor.

21. An electronic unit according to claim 13, wherein the mechanical part comprises cooling means.

22. An electronic unit according to claim 13, wherein the circuit board comprises an opening provided for the electronic component.

23. An electronic unit of a radio system which comprises a mechanical part, a circuit board attached to the mechanical part and an electronic component connected to the circuit board, wherein the electronic unit is produced by a method which comprises:

mounting the electronic component in a cavity provided for the electronic component in the mechanical part;

placing the circuit board on the electronic component and the mechanical part;

connecting the electronic component and the circuit board together using electric coupling members for aligning them with respect to each other and for forming an electrical connection between electric connecting means of the circuit board and electric connecting means of the electronic component;

attaching the electronic component and the circuit board to each other and to the mechanical part automatically so that the electronic component will be in contact with the mechanical part.

24. An electronic unit according to claim 23, wherein the electric coupling members are screws.

25. An electronic unit according to claim 23, wherein the electronic component and the circuit board are attached to each other and to the mechanical part automatically by screwing.

26. An electronic unit according to claim 23, wherein the electronic component is cooled via the mechanical part.

27. An electronic unit according to claim 23, wherein the electronic component is earthed via the mechanical part.

28. An electronic unit according to claim 23, wherein the electric connecting means of the circuit board are connecting areas of the circuit board.

29. An electronic unit according to claim 23, wherein the electric connecting means of the electronic component are connecting strips of the electronic component.

30. An electronic unit according to claim 23, wherein the electronic component is a high-frequency power transistor.

31. An electronic unit according to claim 23, wherein the mechanical part comprises cooling means.

32. An electronic unit according to claim 23, wherein the circuit board comprises an opening provided for the electronic component.

* * * * *